United States Patent
Gust, Jr. et al.

(10) Patent No.: US 9,076,972 B2
(45) Date of Patent: Jul. 7, 2015

(54) SOLUBLE PORPHYRIN POLYMERS

(71) Applicants: John Devens Gust, Jr., Mesa, AZ (US); Paul Anthony Liddell, Apache Junction, AZ (US)

(72) Inventors: John Devens Gust, Jr., Mesa, AZ (US); Paul Anthony Liddell, Apache Junction, AZ (US)

(73) Assignee: ARIZONA BOARD OF REGENTS, A BODY CORPORATE OF THE STATE OF ARIZONA ACTING FOR AND ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 43 days.

(21) Appl. No.: 13/907,452

(22) Filed: May 31, 2013

(65) Prior Publication Data
US 2013/0324686 A1 Dec. 5, 2013

Related U.S. Application Data

(60) Provisional application No. 61/654,463, filed on Jun. 1, 2012.

(51) Int. Cl.
*H01L 51/00* (2006.01)
*C07D 487/22* (2006.01)
*H01L 51/05* (2006.01)
*H01L 51/42* (2006.01)

(52) U.S. Cl.
CPC ......... *H01L 51/0077* (2013.01); *H01L 51/0035* (2013.01); *H01L 51/009* (2013.01); *H01L 51/0504* (2013.01); *H01L 51/42* (2013.01)

(58) Field of Classification Search
CPC ....................................................... H01L 51/00
USPC ............................ 526/259; 540/145; 528/423
See application file for complete search history.

(56) References Cited

U.S. PATENT DOCUMENTS 8,669,359 B2  3/2014 Gust et al.

FOREIGN PATENT DOCUMENTS

| JP | 63-135387 | 6/1988 |
| JP | 01-006949 | 1/1989 |
| JP | 2003-031832 | 1/2003 |
| WO | WO 2008/109467 | 9/2008 |

OTHER PUBLICATIONS

International Search Report and Written Opinion dated Jun. 17, 2006 for PCT/US2008/055545, filed Feb. 29, 2008 (14 pages).
Basu J. et al, "Photoelectrochemical characterisation of porphyrin-coated electrodes," Solar Energy Materials, vol. 21, Issue 4, pp. 317-325 (1991), Jan. 14, 2015.
Bedioui F et al., "Immobilization of Metalloporphyrins in Electropolymerized Films: Design and Applications," Acc. Chem. Res., vol. 28, Issue 1, pp. 30-36 (1995).
Bettelheim A. et al., "Electrochemistry of various substituted aminophenyl iron porphyrins, Part I. Redox properties of dissolved, absorbed and electropolymerized species", Journal of Electroanalytical Chemistry, vol. 266, Issue 1, pp. 93-108 (1989).
Bettelheim A. et al., "Electrocatalysis of dioxygen reduction in aqueous acid and base by multimolecular layer films of electropolymerized cobalt tetra(0-aminophenyl)porphyrin," Journal of Electroanalytical Chemistry, vol. 217, Issue 2, pp. 271-286 (1987).
Bettelheim A. et al., "Electrochemical Polymerization of Amino-, Pyrrole-, and Hydroxy-Substituted Tetraphenylporphyrins," Inorganic Chemistry, vol. 26, Issue 7, pp. 1009-1017 (1987).
Boyd, P.D.W. et al., "Fullerene-Porphyrin Constructs," Accounts of Chemical Research, vol. 38, Issue 4, pp. 235-242 (2005).
Bruti E. M. et al.,"Electropolymerization of Tetrakis (o-aminophenyl)porphyrin and Relevant Transition Metal Complexes from Aqueous Solution. The Resulting Modified Electrodes as Potentiometric Sensors",. Electroanalysis, vol. 11, Issue 8, pp. 565-572 (1999).
Duanmu C.S. et al., "Synthesis of Covalently-linked Linear Donor-Acceptor Copolymers Containing Porphyrins and Oligothiophenes," Chinese Journal of Chemistry, vol. 22, Issue 8, pp. 779-781 (2004).
Feng X.et al., "An efficient synthesis of highly functionazlied asymmetric porphyrins with organolithium reagents," J. Chem. Soc., Perkin Trans., Issue 1, pp. 1030-1038 (2001).

Structure 1

Feng, X. and M.O. Senge, "Facile and Efficient Synthesis of Functionalized Asymmetric Porphyrins with Organolithium Reagents," Proceedings of the Fourth International Conference on Synthetic Organic Chemistry (ECSOC-4), www.mdpi.org/ecsoc-4.htm, Sep. 1-30, 2000, 7 pages [accessed Dec. 11, 2009].
Fish, J.R. et al., "Synthesis and Electrochemistry of Conductive Copolymeric Porphyrins," Chem. Mater., vol. 4, Issue 4, pp. 795-803 (1992).
Griveau S. et al., "Comparative study of electropolymerized cobalt porphyrin and phthalocyanine based films for the electrochemical activation of thiols," Journal of Materials Chemistry, vol. 12, Issue 2, pp. 225-232 (2002).
Laha J.K. et al., "A Scalable Synthesis of Meso-Substituted Dipyrromethanes," Organic Process Research & Development, vol. 7, Issue 6, pp. 799-812 (2003).
Li G. et al., "Very stable, highly electroactive polymers of zinc(II)-5,15-bisthienylphenyl porphyrin exhibiting charge-trapping effects," Polymer, vol. 46, Issue 14, pp. 5299-5307 (2005).
Liddell P.A. et al., "Porphyrin-Based Hole Conducting Electropolymer," Chem.Mater., vol. 20, Issue 1, pp. 134-142 (2008).
Lin C. Y. et al., "Synthesis, electrochemistry, absorption and electropolymerization of aniline-ethynyl metalloporphyrins," Dalton Transactions, Issue 2, pp. 396-401 (2005).
Macor K. A. et al., "Porphyrin Electrode Films Prepared by Electrooxidation of Metalloprotoporphyrins," J. Am. Chem. Soc., vol. 105, Issue 17, pp. 5601-5607 (1983).
Macor K. A. and T.G. Spiro, "Oxidative Electrochemistry of Electropolymerized Metalloprotoporphyrin Films," Journal of Electroanalytical Chemistry, vol. 163, Issue 1-2, pp. 223-236 (1984).
Macor K. A. et al., "Electrochemical and Resonance Raman Spectroscopic Characterization of Polyaniline and Polyaniline-Metalloporphyrin Electrode Films," Inorganic Chemistry, vol. 26, Issue 16, pp. 2594-2598 (1987).
Malinski, T. et al., "Conductive Polymeric Cu(II) Tetrakis(3-methoxy-4-hydroxyphenyl) porphyrin as a Photosensitizer in a Photoelectrochemical Cell," Advanced Materials, vol. 4, Issue 5, pp. 354-357 (1992).
Maree C. H. M. et al., "Photovoltaic effects in porphyrin polymer films and heterojunctions," Journal of Applied Physics, vol. 80, Issue 6, pp. 3381-3389 (1996).
Mortimer R. J., "Electrochromic materials," Chemical Society Reviews, vol. 26, Issue 3 147-156 (1997).
Poriel C. et al., "Anodic oxidation and physicochemical properties of various porphyrin-fluorenes or—spirobifluroenes: Synthesis of new polymers for heterogeneous catalytic reactions," Journal of Electroanalytical Chemisty, vol. 583, Issue 1, pp. 92-103 (2005).
Radziszewski J.G., et al., "Polarized Infrared Spectra of Photooriented Matrix-Isolated Free-Base Porphyrin Isotopomers," J. Phys. Chem., vol. 99, Issue 39, pp. 14254-14260 (1995).
Savenije T. J. et al., "Hole transport in porphyrin thin films," Physical Review B, Condensed Matter, vol. 64, Issue 11, pp. 115323-1-115323-9 (2001).
Vail S.A. et al., "Energy and Electron Transfer in Polyacetylene-Linked Zinc-Porphyrin—[60] Fullerene Molecular Wires," Chemistry—A. European Journal vol. 11, Issue 11, pp. 3375-3388 (2005).
Wamser C.C. et al., "Thin films of polymeric porphyrins: interfacial and eletropolymerizations," Polymer Preprints, 37 (2): 384-385 (Aug. 1996).
White B. A. et al., "Electroactive porphyrin films from electropolymerized metallotetra(o-aminophenyl)porphyrins," Journal ofElectroanalytical Chemistry, vol. 189, Issue 2, pp. 345-352 (1985).
Wiehe A. et al., "Lead structures for applications in photodynamic therapy. Part 1: Synthesis and variation of m-THPC (Temoporfin) related amphiphilic A2BC-type porphyrins," Tetrahedron, vol. 61, Issue 23, pp. 5535-5564 (2005).
Wohrle D., "Porphyrins, phthalocyanines and related systems in polymer phases," Journal of Porphyrins and Phthalocyanines, vol. 4, Issue 4, pp. 418-424 (2000).
Yu L. et al., "Excited-State Energy-Transfer Dynamics in Self-Assembled Triads Composed of Two Porphyrins and an Intervening Bis(dipyrrinato)metal Complex," Inorg. Chem., vol. 42, Issue 21, pp. 6629-6647 (2003).
Zhang Y., "DFT study on the influence of meso-phenyl substitution on the geometric, electronic structure and vibrational spectra of free base porphyrin," Chem. Phys., vol. 315, Issue 1-2, pp. 201-213 (2005).
Zhu, B.-K. et al., "Enhancing the photoconductivity of polyimides by incorporating intrinsic chromosome units," Polyimides and Other High Temperature Polymers 3: 423-437 (2005).
Ichihara K. et al., "New and efficient synthesis of oligomeric porphyrins via stepwise nucleophilic substitution of aminoporphyrins to cyanuric chloride", Chemistry Letters, vol. 24, Issue 8, pp. 631-632 (1995) (abstract included only).

*Primary Examiner* — Duc Truong
(74) *Attorney, Agent, or Firm* — Fish & Richardson P.C.

(57) ABSTRACT

Porphyrin polymers of Structure 1, where n is an integer (e.g., 1, 2, 3, 4, 5, or greater)

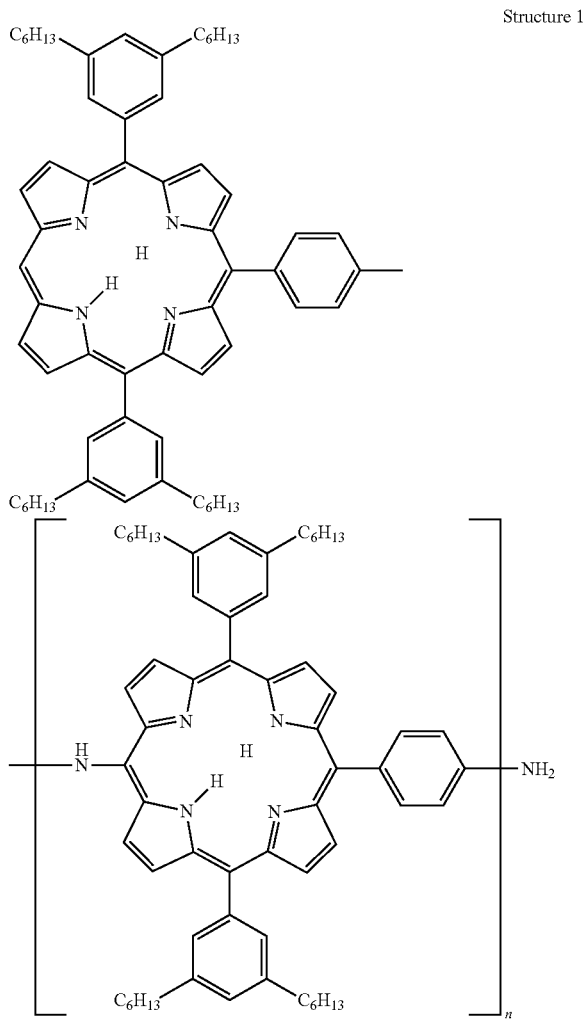

are synthesized by the method shown in FIGS. 2A and 2B. The porphyrin polymers of Structure 1 are soluble in organic solvents such as 2-MeTHF and the like, and can be synthesized in bulk (i.e., in processes other than electropolymerization). These porphyrin polymers have long excited state lifetimes, making the material suitable as an organic semiconductor for organic electronic devices including transistors and memories, as well as solar cells, sensors, light-emitting devices, and other opto-electronic devices.

14 Claims, 13 Drawing Sheets

Structure 1

$\tau_1 = 9.5$ ns $\tau_2$ and $\tau_{2'} \ll 9.5$ ns $\tau_3 = {\sim}500$ ps $\tau_4 = {\sim}6$ ns $\tau_5 = \tau_{-5} = 210$ ps Structure 6

Structure 7

SOLUBLE PORPHYRIN POLYMERS

CROSS-REFERENCE TO RELATED APPLICATION

This application claims priority to U.S. Provisional Application Ser. No. 61/654,463 filed on Jun. 1, 2012, which is incorporated herein by reference in its entirety.

STATEMENT OF GOVERNMENT INTEREST

This invention was made with government support under DE-FG02-03ER15393 awarded by the Department of Energy. The government has certain rights in the invention.

TECHNICAL FIELD

This invention relates to chemical synthesis of conducting, soluble, solution-processable porphyrin polymers.

BACKGROUND

One of the major applications of conducting polymers is as a component of an "organic" or "bulk heterojunction" photovoltaic cell for making electricity from sunlight. Organic solar cells generally include a layer of transparent indium tin oxide (ITO) on glass, a layer of hole-conducting polymer mixed with an organic or inorganic electron-conducting phase, and a third layer of a low-work-function metal such as aluminum. Light is absorbed by the polymer in the photovoltaic cell; the resulting excitation then migrates to a phase boundary with the electron-conducting phase, and an electron is injected from the polymer. The electrons migrate to the metal through the electron-conducting phase, and holes migrate to the ITO via the polymer, generating a photocurrent.

Conducting polymers for use in organic light-emitting diodes (OLEDs) and organic conductors ("wires"), some of which may be electropolymerized, have been reported. These polymers include, for example, polyacetylenes, polyphenyleneethynylenes (PPE), polyphenylenevinylenes (PPV), polythiophenes, and polyanilines. The structural variations of these polymers are typically changes in the organic substituent groups attached to the basic polymer backbone. The substituents can change the electrical properties of the polymer, its processing and mechanical properties, and its compatibility/interfacing with other materials. Typically, it is possible to write delocalized structures for these polymers that allow conductivity through the polymer backbone. Often, some type of "doping" is required to achieve good conductivity.

Such organic photovoltaic cells have very low efficiencies (i.e., less than about 5%) due to incomplete conversion of excitons to charge separation, recombination of electrons and holes within the organic layer or at the electrodes, and a lack of efficient light absorption throughout the solar spectral range. The lack of electron acceptors covalently bonded to the polymer strands can lead to inefficient conversion of excitons to charge separation, rapid charge recombination, high concentrations of carriers at interface areas (leading to increased recombination), the need to prepare bicontinuous phases of polymer and fullerene or other electron carriers (which adds to processing requirements), and the need to use excessive amounts of the electron transport phase.

SUMMARY

Porphyrin polymers of Structure 1, where n is an integer (e.g., 1, 2, 3, 4, 5, or greater)

Structure 1 are synthesized by the method shown in FIGS. 2A and 2B. The porphyrin polymers of Structure 1 are soluble in organic solvents such as 2-methyltetrahydrofuran (2-MeTHF) and the like, and can be synthesized in bulk (i.e., in processes other than electropolymerization). These porphyrin polymers are conducting (e.g., semiconducting) and have long excited state lifetimes, making the material suitable as an organic semiconductor for organic electronic devices including transistors and memories, as well as solar cells, sensors, light-emitting devices, and other opto-electronic devices.

DETAILED DESCRIPTION

Films of porphyrin and porphyrin-fullerene dyad conducting polymers have been prepared as films on electrodes by electropolymerization, as described in Liddell et al., *Chem. Mater.* 2008, 20, 135-142; Gervaldo et al., *Photochem. Photobiol. Sci.* 2010, 9, 890-900; and U.S. 2010/0065123 entitled "Electrically Conducting Porphyrin and Porphyrin-Fullerene Electropolymers," all of which are incorporated herein by reference. However, use of these materials is limited by the insolubility of the films on the electrodes.

As described herein, solution, bulk chemical synthesis of a class of conducting (e.g., semiconducting), soluble, porphyrin polymers with long excited state lifetimes has been developed. This process yields a porphyrin polymer free or almost free of defects due to reverse linking of monomers, and thus free or almost free of excited state quenching and charge carrier trapping caused by such defects. Accordingly, the porphyrin polymer has long excited state lifetimes, making the material suitable as an organic semiconductor for organic electronic devices including transistors and memories, as well as solar cells, sensors, light-emitting devices, and other opto-electronic devices. Unlike earlier polymers produced by electropolymerization, these soluble polymers, based on a porphyrin monomer designed for polymer solubility, are solution processable, suitable for spin coating, and otherwise able to be handled and used as bulk materials.

Figure 1:
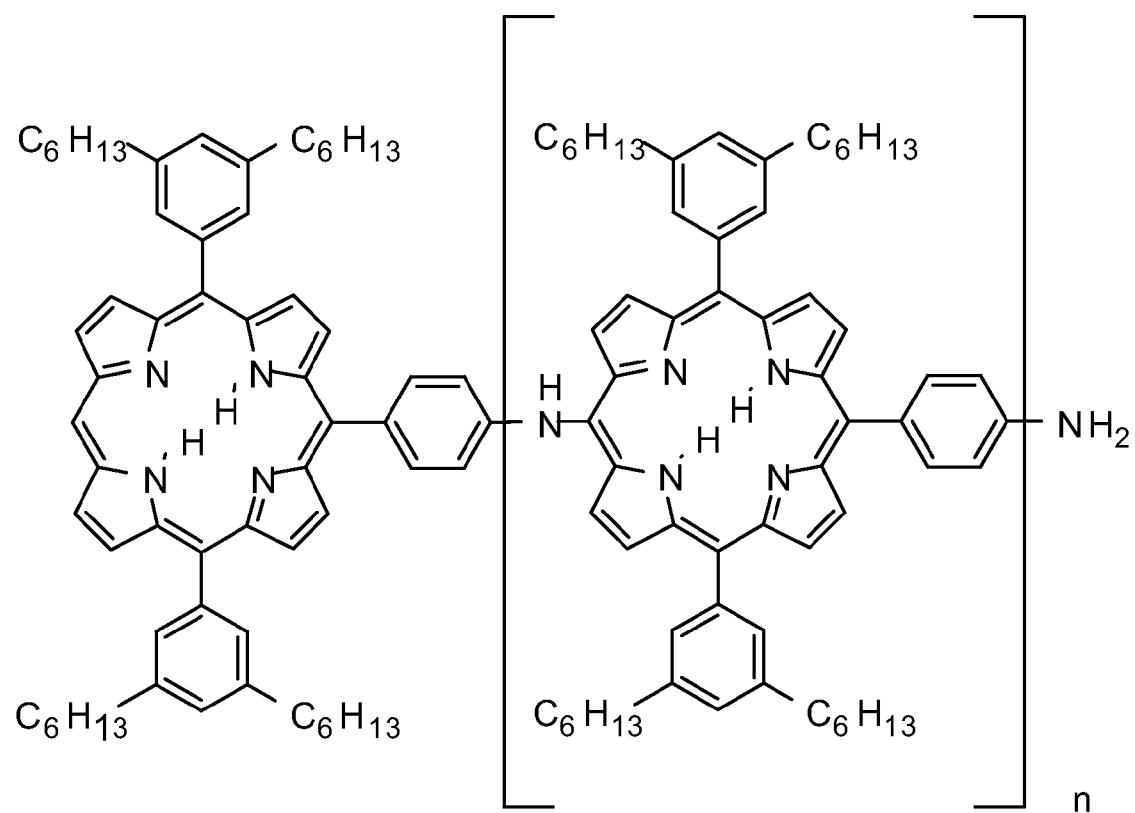
FIG. 1 depicts a porphyrin polymer having Structure 1.
Figure 2A:
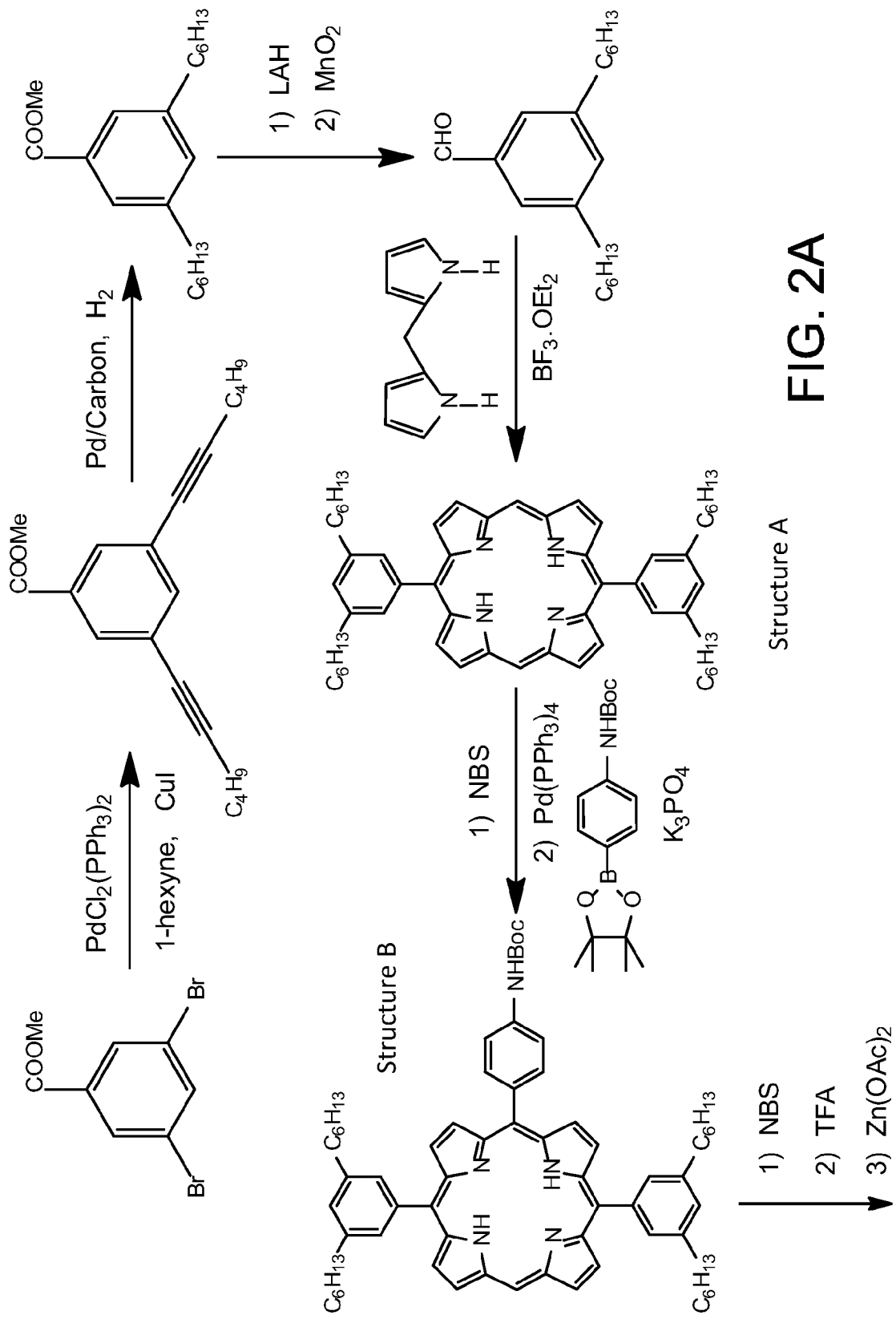
FIGS. 2A and 2B depict synthesis of porphyrin polymers having Structure 1.
Figure 2B:
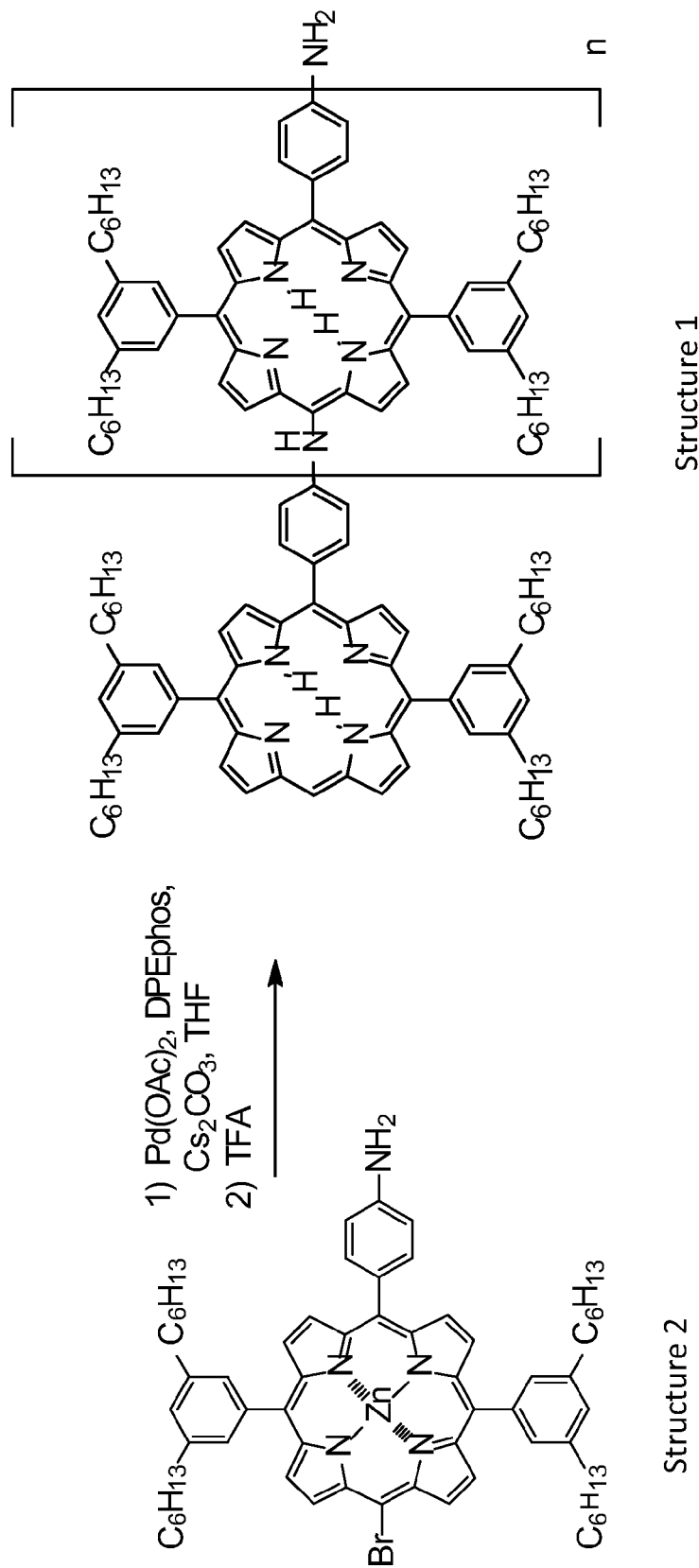
Figures 3, 4:
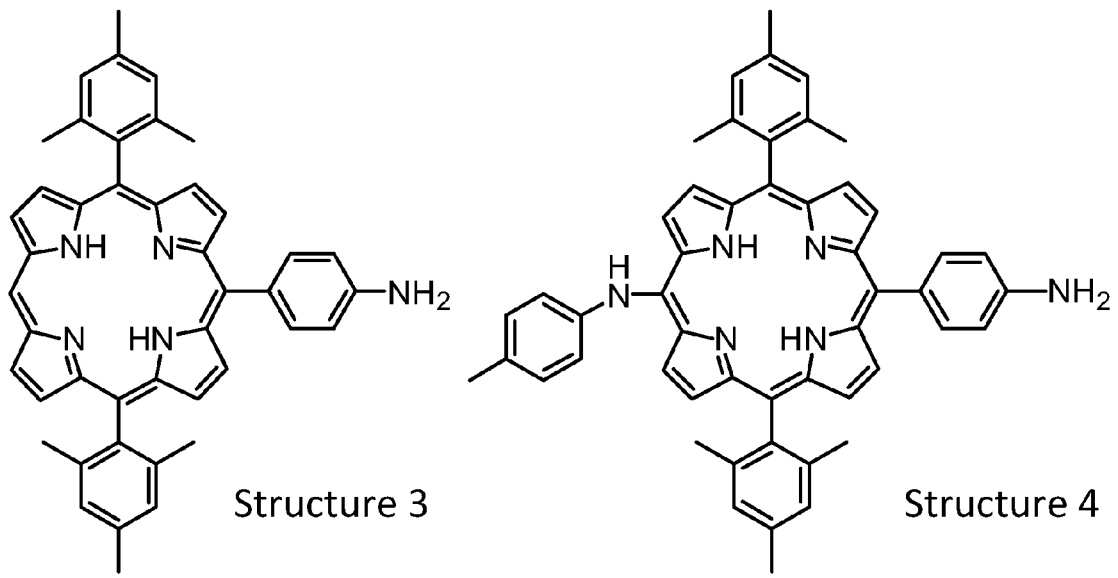
FIG. 3 depicts a model porphyrin monomer having Structure 3.
FIG. 4 depicts a model porphyrin monomer having Structure 4.
Figure 5:
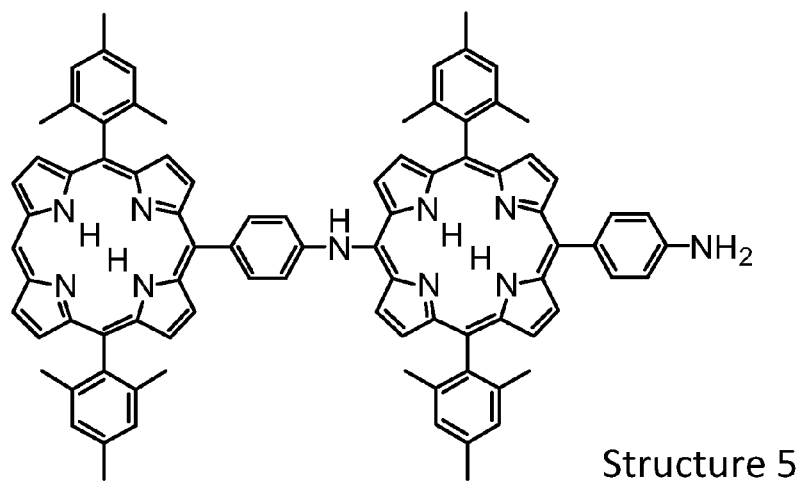
FIG. 5 depicts a porphyrin dyad having Structure 5.

FIG. 1 depicts Structure 1, a conducting porphyrin polymer, where n is an integer. The multiple hexyl chains on each porphyrin render the polymer soluble in organic solvents, or contribute at least in part to such solubility. Steady-state and transient spectroscopic studies have revealed some of the unusual photophysical properties of this material. FIGS. 2A and 2B depict synthesis of Structure 1 via Structure 2, a brominated porphyrin monomer. FIGS. 3 and 4 depict porphyrin monomers having Structures 3 and 4, respectively, and FIG. 5 depicts Structure 5, a porphyrin dyad.

Figure 6:
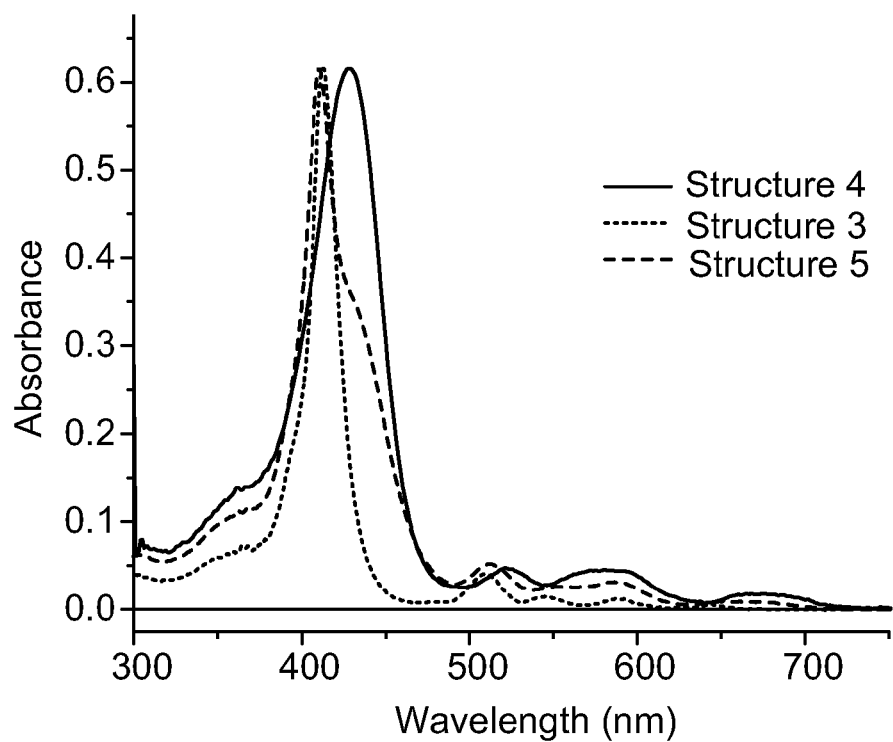
FIG. 6 shows absorbance spectra of porphyrin polymers having Structures 3-5 in 2-methyltetrahydrofuran (2-MeTHF).
Figure 7:
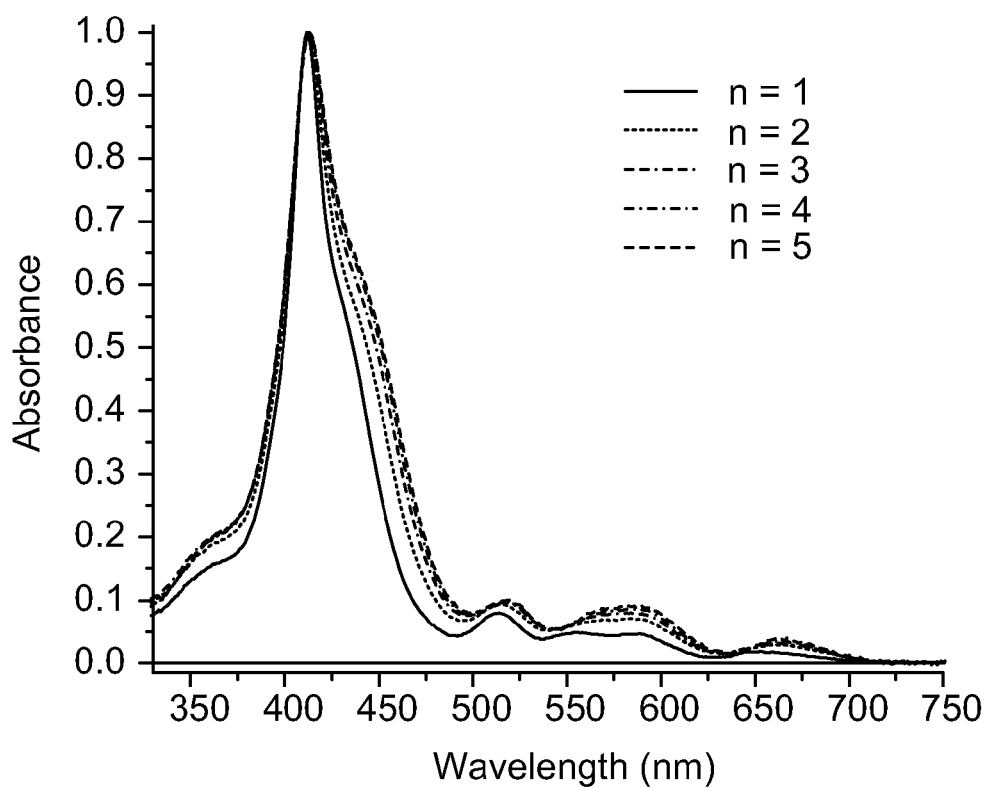
FIG. 7 shows normalized absorbance spectra of polymers having Structure 1.
Figure 8:
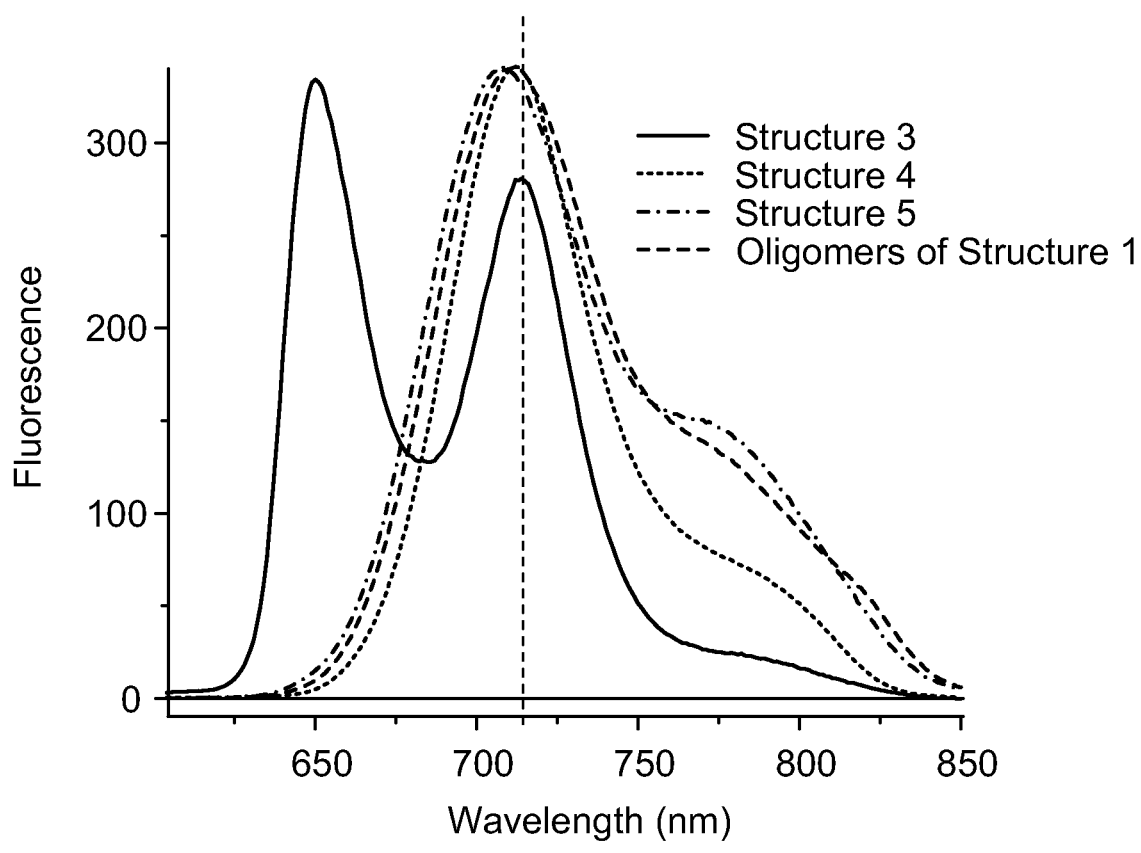
FIG. 8 shows normalized emission spectra of polymers having Structures 3-5 and a mixture of oligomers having Structure 1 in 2-MeTHF.

FIG. 6 shows absorbance spectra of Structures 3, 4, and 5 in 2-methyltetrahydrofuran (2-MeTHF). FIG. 7 shows normalized absorbance spectra of Structure 1 with n=1–5. FIG. 8 shows normalized emission spectra of Structures 3 and 4, dyad 5, and a mixture of oligomers of Structure 1 in 2-MeTHF. In the dyad and oligomers, only emission from the porphyrins bearing nitrogen at a meso-position is seen due, at least in part, to rapid energy transfer from the porphyrin with H at the meso-position.

Figure 9:
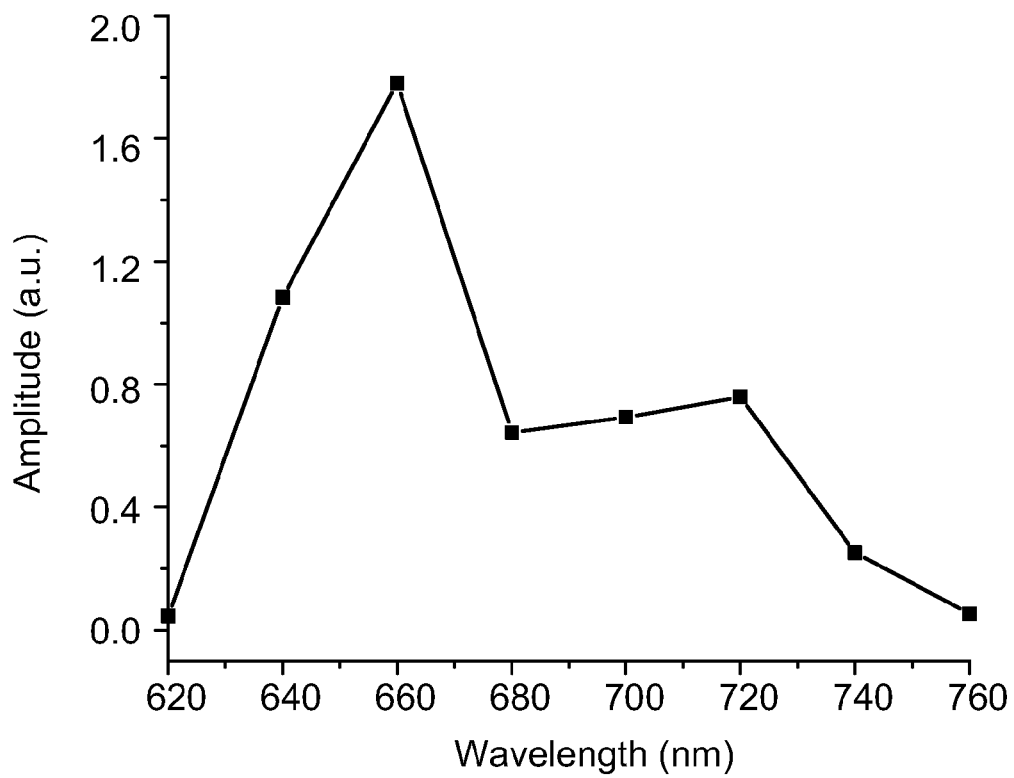
FIG. 9 shows a decay-associated spectrum of emission from a porphyrin polymer having Structure 3 in 2-MeTHF, excitation at 420 nm.
Figure 10:
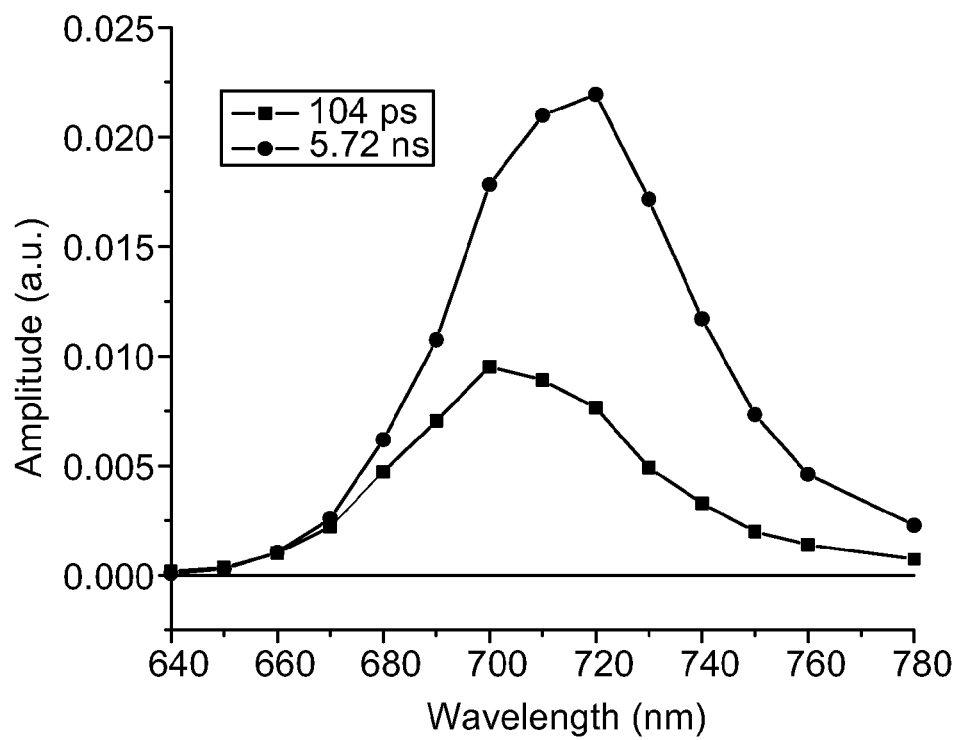
FIG. 10 shows decay-associated spectra of porphyrin polymers having Structure 4 in 2-MeTHF, excitation at 520 nm.
Figure 11:
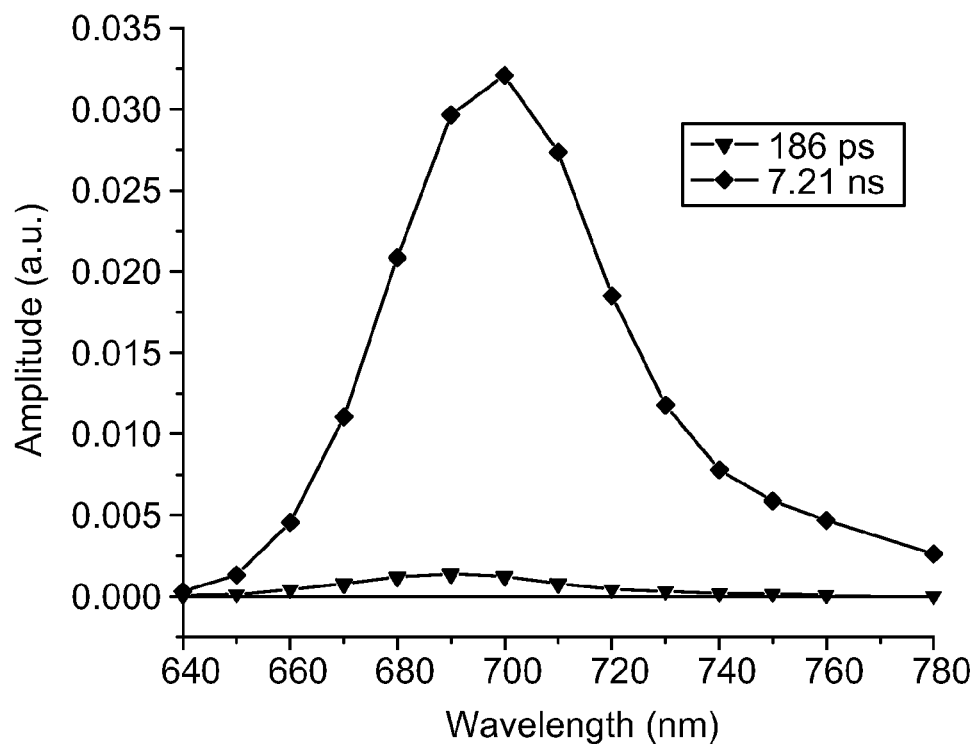
FIG. 11 shows decay-associated spectra of porphyrin polymers having Structure 4 in cyclohexane, excitation at 520 nm.
Figure 12:
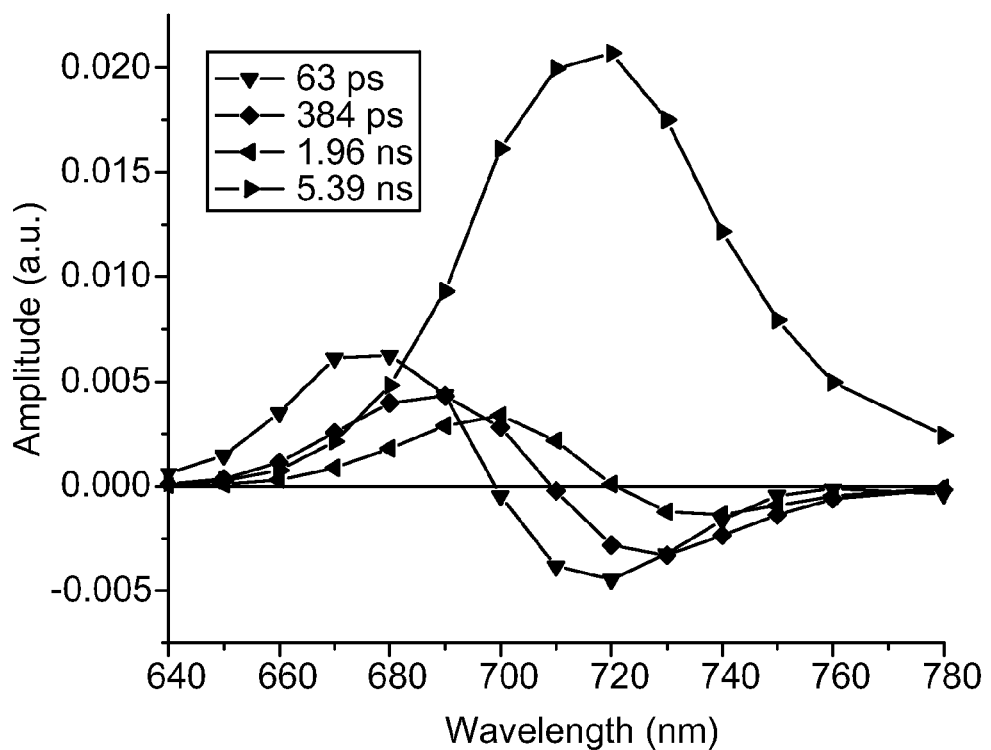
FIG. 12 shows decay-associated spectra of porphyrin polymers having Structure 4 in decanol, excitation at 520 nm.
Figure 13:
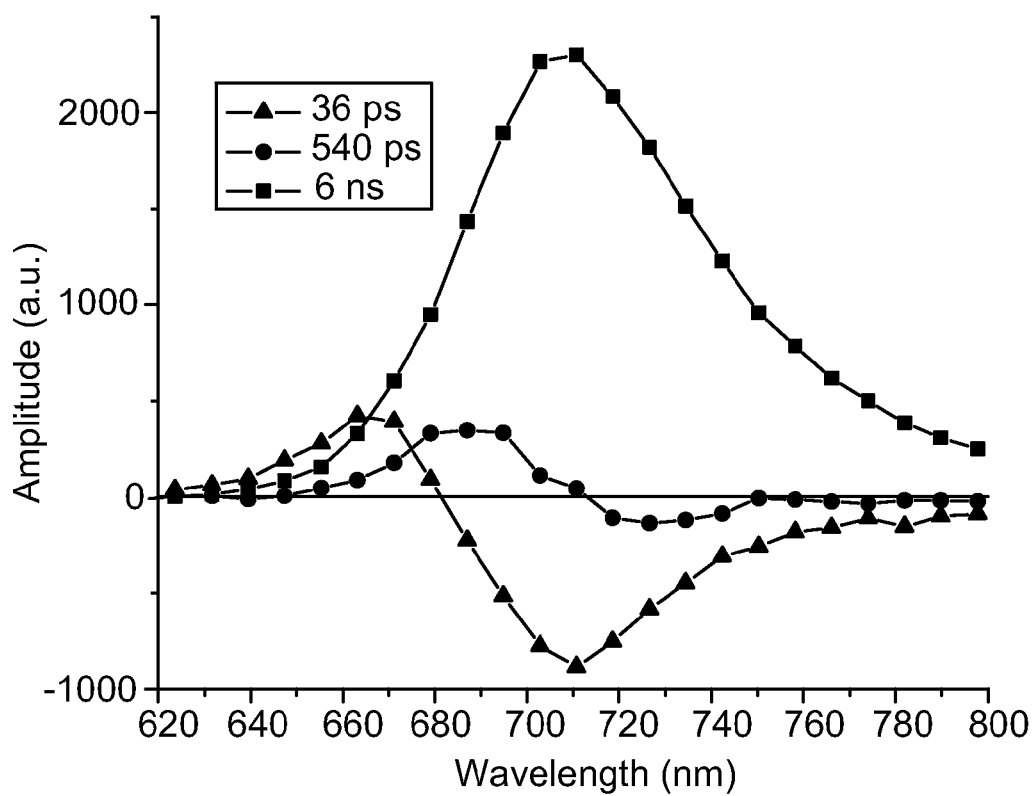
FIG. 13 shows decay-associated spectra of porphyrin polymers having Structure 5 in 2-MeTHF, excitation at 520 nm.
Figure 14:
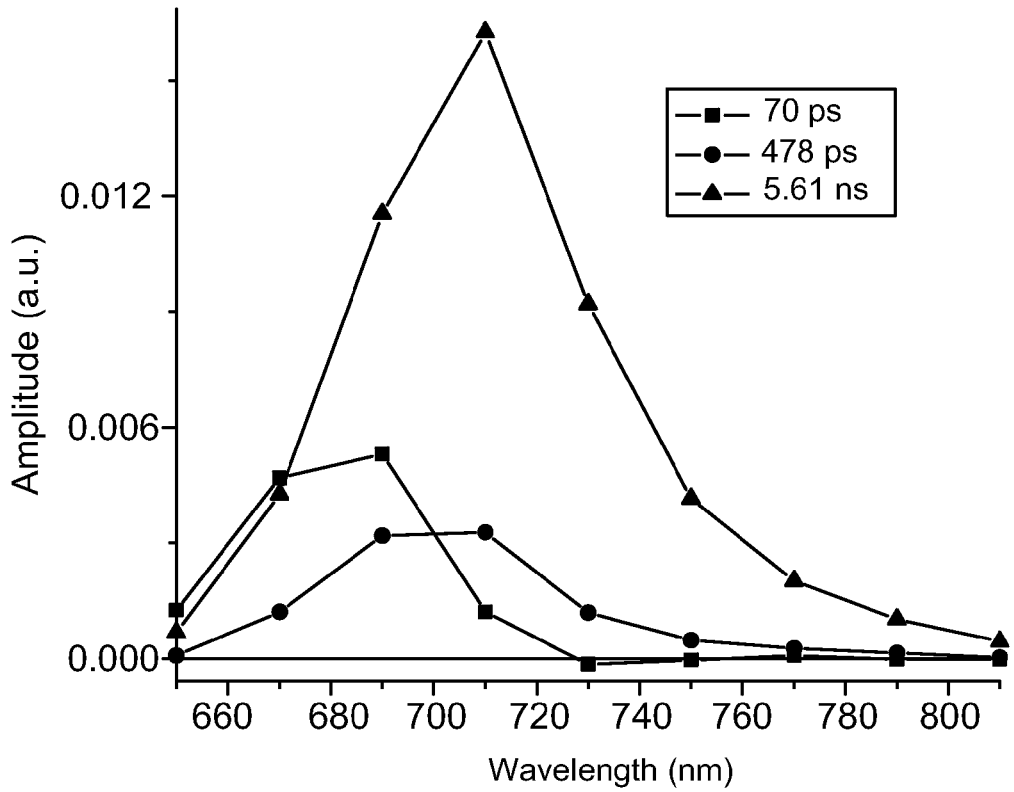
FIG. 14 shows decay-associated spectra of porphyrin polymers having Structure 1 with n=5 in 2-MeTHF, excitation at 420 nm.

Time-resolved emission studies were carried out by the single-photon-timing method in 2-MeTHF. FIG. 9 shows a decay-associated spectrum (DAS) of emission from Structure 3 in 2-MeTHF with excitation at 420 nm ($\tau$=9.53 ns, $\chi^2$=1.06). FIG. 10 shows DAS of Structure 4 in 2-MeTHF with excitation at 520 nm. Two components with time constants of 104 ps and 5.72 ns ($\chi^2$=1.16) were observed. FIG. 11 shows DAS of Structure 4 in cyclohexane, excitation at 520 nm. Two components with time constants of 186 ps (plot 110) and 7.21 ns (plot 112) were observed. FIG. 12 shows DAS of Structure 4 in decanol, excitation at 520 nm. FIG. 13 shows DAS of Structure 5 in 2-MeTHF, excitation at 520 nm. FIG. 14 shows DAS of Structure 1, n=5, in 2-MeTHF, excitation at 420 nm. Roughly comparable DAS spectra were observed for Structure 4 and polymers of Structure 1 of various lengths. DAS similar to the above were obtained for Structure 5 with excitation at 450 nm, where the unit without a meso nitrogen does not absorb. Thus, none of the components appear to represent energy transfer.

Figure 15:
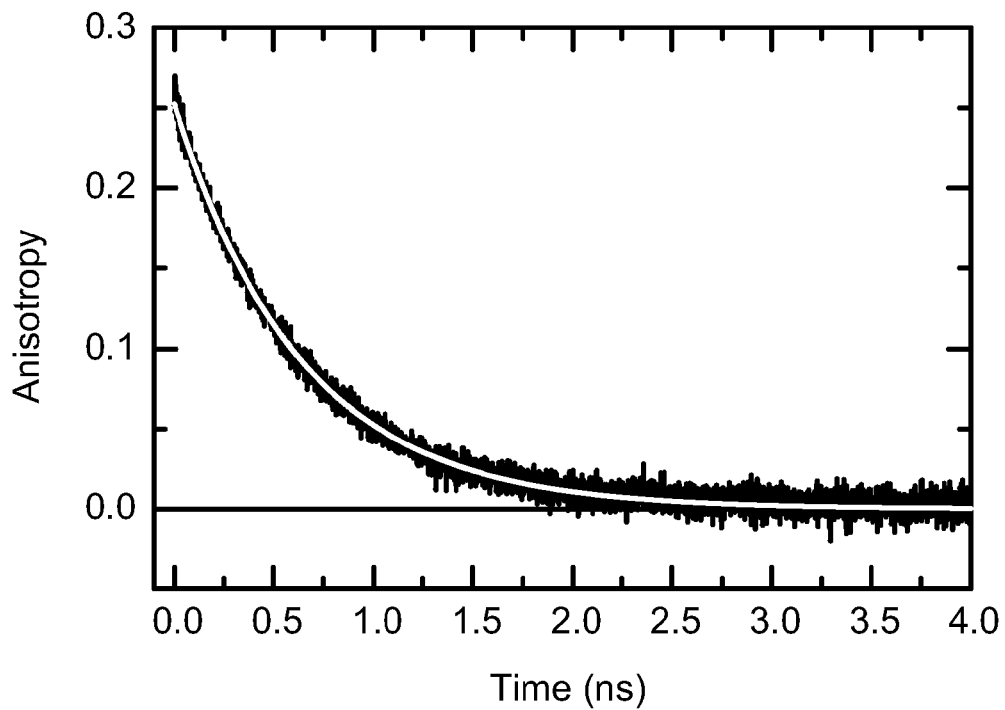
FIG. 15 shows fluorescence anisotropy of a porphyrin dyad having Structure 1 with n=1.
Figure 16:
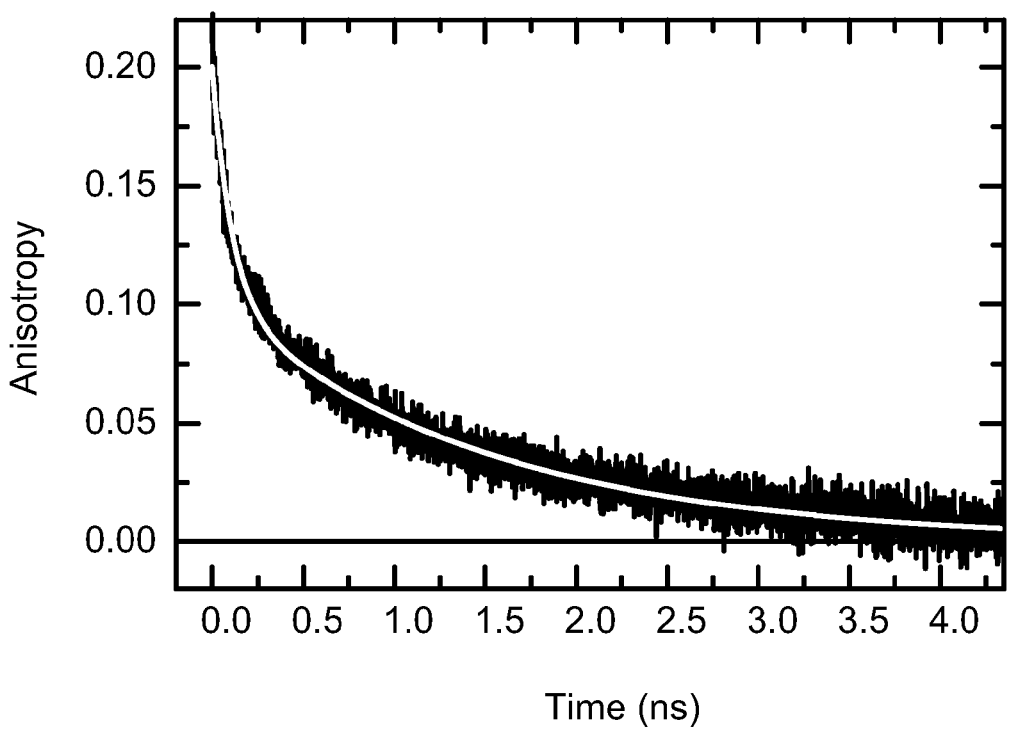
FIG. 16 shows fluorescence anisotropy of a porphyrin oligomer having Structure 1 with n=3.

Fluorescence anisotropy experiments were carried out on Structure 1 (n=1) and on Structure 1 (n=3) with $\lambda_{ex}$=680 nm and $\lambda_{em}$=780 nm. FIG. 15 shows Structure 1, n=1, and FIG. 16 shows Structure 1, n=3. The results show a time constant for excitation hopping between porphyrins in the polymer chain of 210 ps.

Figure 17:
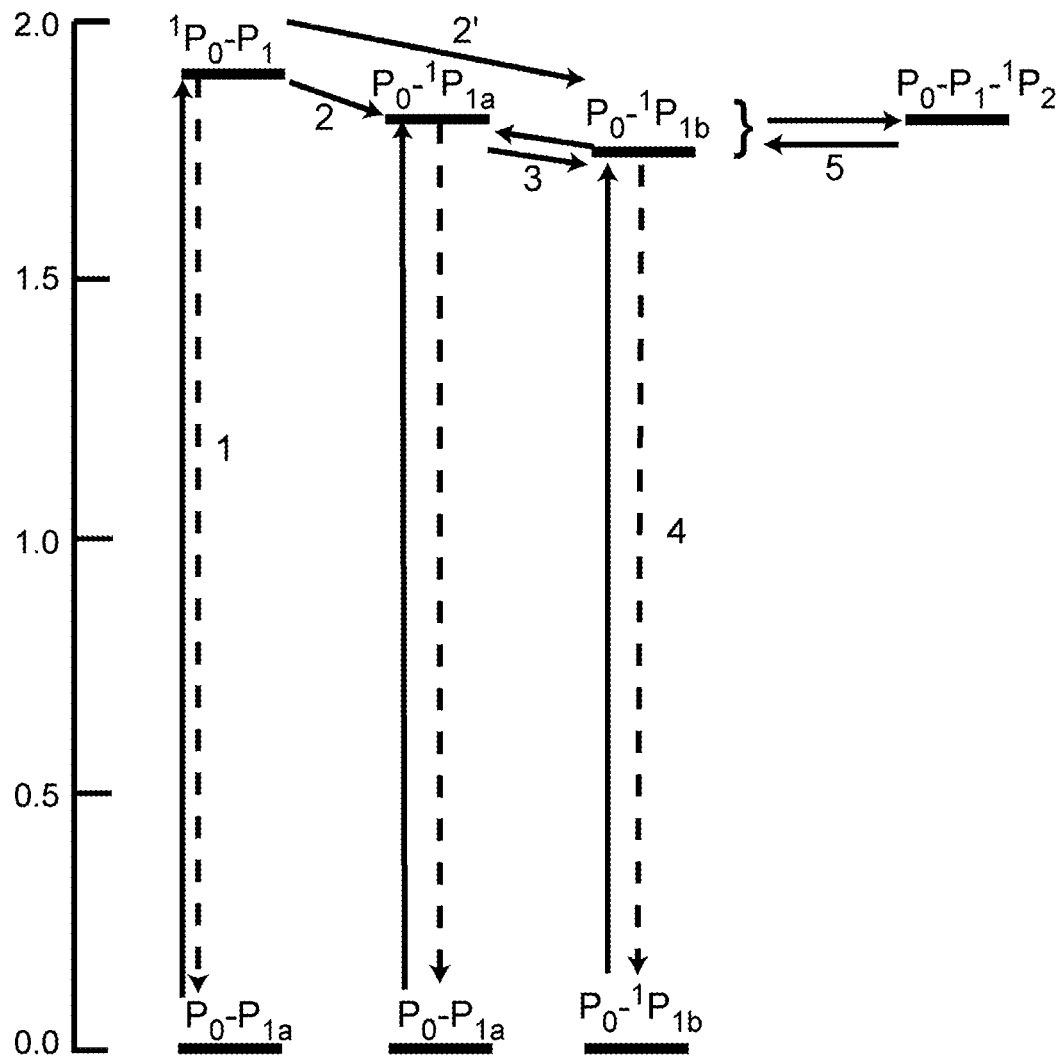
FIG. 17 depicts a schematic diagram of transient states of Structure 1 and some of their interconversion pathways and time constants.

Structure 1 is readily soluble in organic solvents known in the art due at least in part to the hexyl chains. The absorption spectrum is broad, and extends to wavelengths longer than 700 nm. There is a weak electronic interaction between porphyrin moieties observed in absorption. The absorption and emission spectra of Structure 4 and the polymers of Structure 1 are solvent polarity dependent, suggesting an excited state with charge transfer character. Photochemical properties of the polymers of Structure 1 are summarized in FIG. 17, which shows a schematic diagram of transient states of polymers of Structure 1 and some of their interconversion pathways and time constants. The polymer of Structure 1 is represented as $P_0$-$P_1$-$P_n$. Excitation of $P_0$ is followed by very rapid energy transfer to $P_1$, which is also formed by direct absorption. $P_1$ exists in several conformations. The initially formed excited states of $P_1$ relax through two or more short-lived species (~50-600 ps in 2-MeTHF), likely involving different conformations about the C—N bonds, to the least-energetic excited state. The $^1P_1$ state is fluorescent and decays in ~6 ns, but can also undergo singlet energy transfer to yield $^1P_2$ ... $^1P_n$ with a time constant of 210 ps. In some solvents, additional excited state conformations are present.

Figure 18:
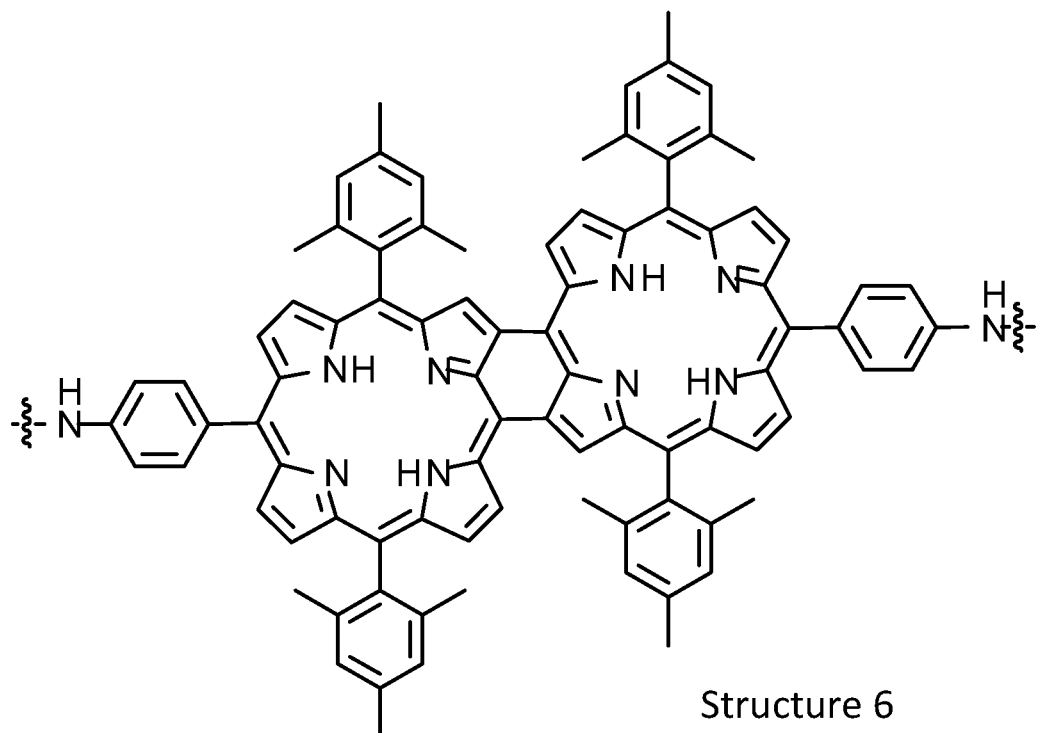
FIG. 18 depicts a porphyrin electropolymer having Structure 6.
Figure 19:
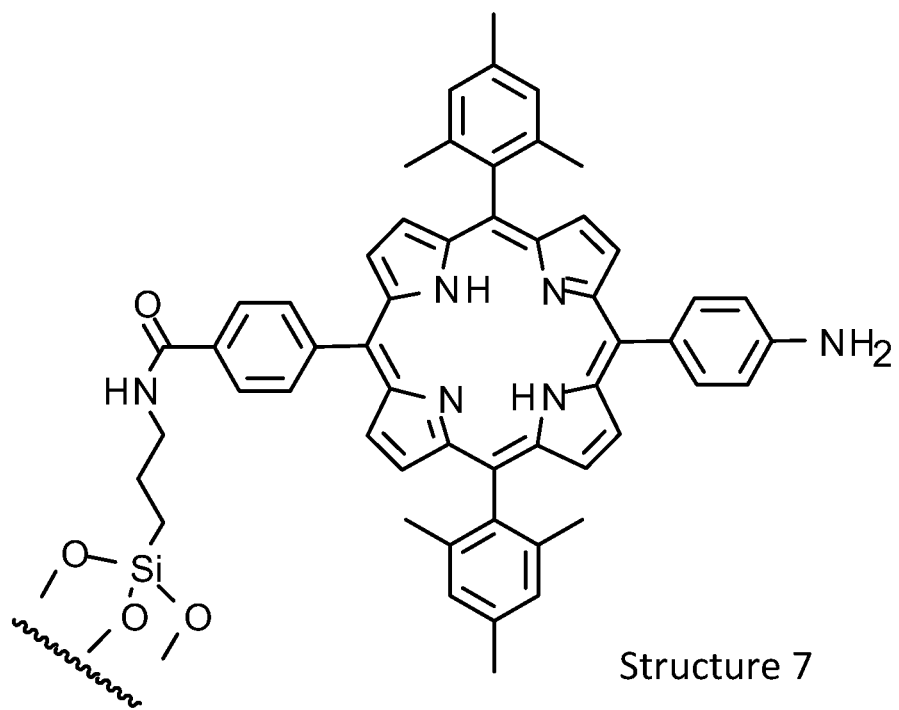
FIG. 19 depicts a structure of a porphyrin polymer having Structure 7 bound to a surface.
Figure 20:
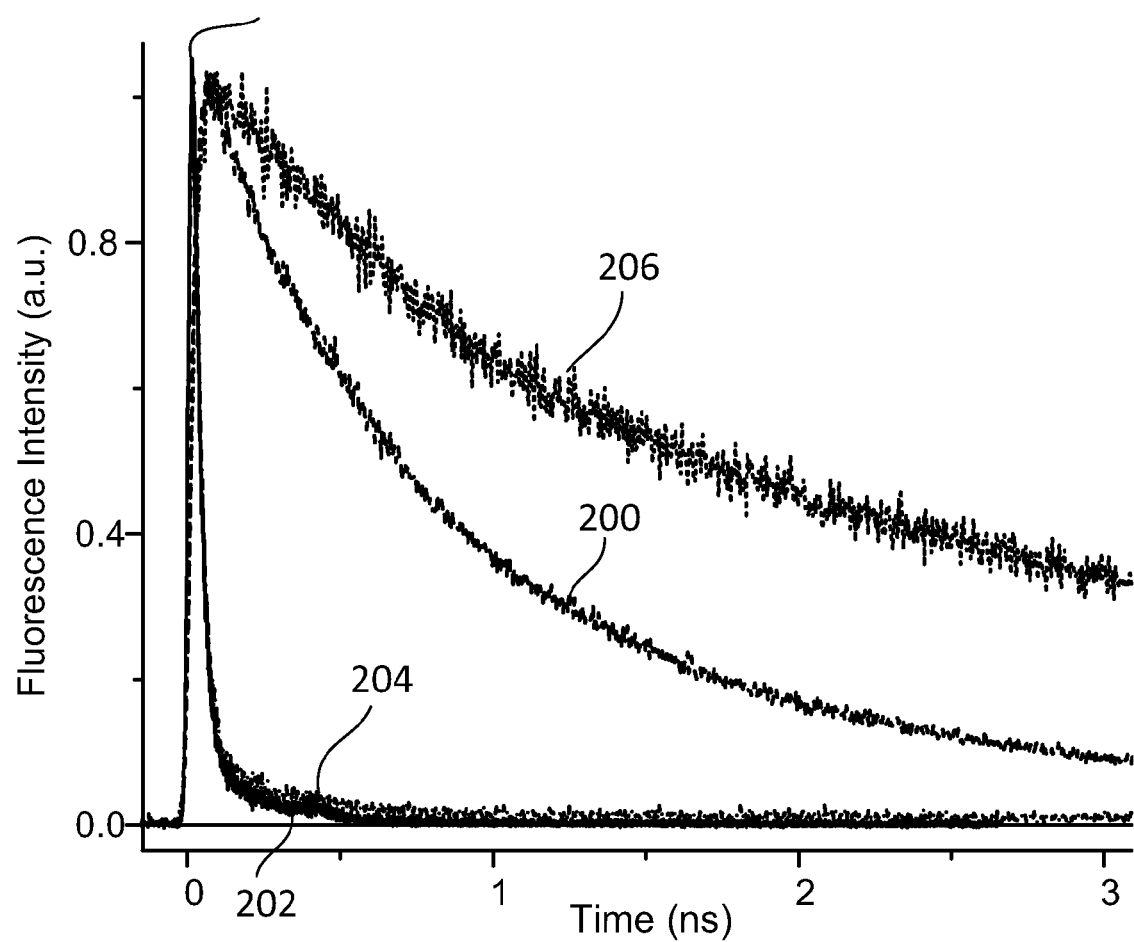
FIG. 20 depicts normalized fluorescence decays of porphyrin electropolymers on indium tin oxide (ITO).

Molecules similar to Structure 2 but lacking the bromine electropolymerize, but electropolymerization can introduce defects such as Structure 6, shown in FIG. 18, that act as excitation and charge traps. FIG. 19 shows ITO-bound Structure 7. FIG. 20 shows normalized fluorescence decays of electropolymers on ITO, including the polymer of Structure 6 on ITO-bound Structure 7 (plot 200), the polymer of Structure 6 on ITO (plot 202), the polymer of Structure 6 on silane-treated ITO (plot 204), and Structure 7 bound to ITO via an aminopropylsiloxy group (plot 206). Polymers such as those shown in Structure 6 have very short excited state lifetimes, as shown in FIG. 20. When the electrode surface is first derivatized with a porphyrin of Structure 7, formation of such traps cannot occur, or do not occur widely. Electropolymeric films prepared in this way show much longer excited state lifetimes with charge transfer character and energy migration between porphyrins, and thus are suitable for construction of solar cells or other devices.

Synthesis

Porphyrin polymers having Structure 1 are synthesized by the method shown in FIGS. 2A and 2B as described below.

5,15-Bis(3,5-dihexylphenyl)porphyrin (Structure A)

To a flask containing 3.3 g (22.59 mmol) of 2,2'-dipyrromethane, 6.20 g (22.68 mmol) of 3,5-dihexylbenzaldehyde and 2.3 L of chloroform was added 1.72 mL of boron trifluoride diethyl etherate. After stirring under an argon atmosphere in the dark for 30 min, 2,3-dichloro-5,6-dicyano-1,4-benzoquinone (DDQ) (5.14 g) was added to the reaction mixture and stirring was continued for another 1 h. The dark solution was reduced in volume to approximately 1 L by evaporation at reduced pressure and then gently shaken with aqueous sodium bicarbonate (1 L). Once the two layers had separated the organic phase was washed a further three times with fresh bicarbonate solution. The organic layer was then concentrated to a viscous oil and this material was chromatographed on silica gel (hexanes/methylene chloride, 5:1 to 3:1). The appropriate fractions were combined, the solvent was evaporated at reduced pressure, and the residue was recrystallized from methylene chloride/methanol to give 3.564 g (40% yield) of the desired porphyrin. $^1$H NMR (400 MHz) δ−3.08 (2H, s, —NH), 0.92-0.95 (12H, t, J=7 Hz, —CH$_3$), 1.37-1.45 (16H, m, —CH$_2$—), 1.50-1.58 (8H, m, —CH$_2$—), 1.92-1.85 (8H, m, —CH$_2$—), 2.92 (8H, t, J=8 Hz, —CH$_2$—), 7.43 (2H, s, Ar—H), 7.91 (4H, s, Ar—H), 9.12 (4H, d, J=5 Hz, β-H), 9.38 ((4H, d, J=5 Hz, β-H), 10.30 (2H, s, meso-H); MALDI-TOF-MS m/z calcd. for $C_{56}H_{70}N_4$ 798.6, obsd. 798.5; UV/vis (CH$_2$Cl$_2$) 408, 503, 537, 576, 631 (nm).

5,15-Bis(3,5-dihexylphenyl)-10-bromoporphyrin

To a flask containing 1.00 g (1.25 mmol) of 5,15-bis(3,5-dihexylphenyl)porphyrin and 200 mL of chloroform was added 223 mg (1.25 mmol) of N-bromosuccinimide (NBS). After stirring the reaction mixture for 15 min, TLC (hexanes/methylene chloride, 2:1) indicated that the product was present together with lesser amounts of the starting material and the dibrominated porphyrin. The reaction mixture was concentrated to a viscous oil and this material was chromatographed on silica gel (hexanes/methylene chloride, 4:1/3:1) to give 1.116 g (68% yield) of the desired product. $^1$H NMR (400 MHz) δ−2.97 (2H, s, —NH), 0.93 (12H, t, J=7 Hz, —CH$_3$), 1.36-1.44 (16H, m, —CH$_2$—), 1.48-1.56 (8H, m, —CH$_2$—), 1.83-1.91 (8H, m, —CH$_2$—), 2.89 (8H, t, J=8 Hz, —CH$_2$—), 7.43 (2H, s, Ar—H), 7.85 (4H, s, Ar—H), 8.99 (2H, d, J=4 Hz, β-H), 9.00 (2H, d, J=4 Hz, β-H), 9.28 (2H, d, J=4 Hz, β-H), 9.73 (2H, d, J=5 Hz, β-H), 10.16 (1H, s, meso-H); MALDI-TOF-MS m/z calcd. for $C_{56}H_{69}N_4Br$ 876.5, obsd. 876.4; UV/vis (CH$_2$Cl$_2$) 416, 512, 547, 588, 645 (nm).

5,15-Bis(3,5-dihexylphenyl)-10-(4-tert-butylphenylcarbamate)porphyrin (Structure B)

To a heavy walled glass tube was added 1.00 g (1.14 mmol) of 5,15-bis(3,5-dihexylphenyl)-10-bromoporphyrin, 3.64 g (11.39 mmol) of 4-(Boc-amino)benzeneboronic acid pinacol, 4.83 g (22.78 mmol) of potassium phosphate tribasic and 20 mL of tetrahydrofuran (THF). The suspension was flushed with a stream of argon gas for 10 min, 132 mg (0.11 mmol) of tetrakis(triphenylphosphine) palladium(0) was added and the argon flushing procedure was continued for an additional 10 min. The tube was then sealed with a Teflon™ screw plug and warmed to 67° C. After 17 h, the tube was cooled and TLC (hexanes/methylene chloride, 1:1) of the contents indicated that all the starting material had been consumed. The reaction mixture was filtered through celite and the filtrate was concentrated to dryness. This material was chromatographed on silica gel (hexanes/methylene chloride, 2:1/1:1) to give 985 mg (87% yield) of the required porphyrin. $^1$H NMR (400 MHz) δ−2.98 (2H, s, —NH), 0.92 (12H, t, J=7 Hz, —CH$_3$), 1.32-1.42 (16H, m, —CH$_2$—), 1.46-1.56 (8H, m, —CH$_2$—), 1.64 (9H, s, —CH$_3$), 1.82-1.88 (8H, m, —CH$_2$—), 2.88 (8H, t, J=8 Hz, —CH$_2$—), 6.83 (1H, s, —NH), 7.41 (2H, s, Ar—H), 7.75 (2H, d, J=8 Hz, Ar—H), 7.82 (4H, s, Ar—H), 8.13 (2H, d, J=8 Hz, Ar—H), 8.89 (2H, d, J=4 Hz, β-H), 8.93 (2H, d, J=4 Hz, β-H), 9.04 (2H, d, J=4 Hz, β-H), 9.32 (2H, d, J=4 Hz, β-H), 10.19 (1H, s, meso-H); MALDI-TOF-MS m/z calcd. for $C_{67}H_{83}N_5O_2$ 989.6, obsd. 989.6; UV/vis (CH$_2$Cl$_2$) 414, 510, 545, 584, 639 (nm).

5,15-Bis(3,5-dihexylphenyl)-10-bromo-20-(4-tert-butylphenylcarbamate)porphyrin

To a 1 L flask containing 2.90 g (2.93 mmol) of 5,15-bis (3,5-dihexylphenyl)-10-(4-tert-butylphenylcarbamate)porphyrin and 400 mL of chloroform was added 547 mg (3.07 mmol) of N-bromosuccinimide. The solution was stirred for 20 min. TLC (hexanes/methylene chloride, 1:1) indicated that the reaction was complete. The reaction mixture was washed with aqueous sodium bicarbonate, dried over anhydrous sodium sulfate, and then concentrated to dryness under reduced pressure. The resulting material was chromatographed on silica gel (hexanes/methylene chloride, 5:2/3:2) to give 2.813 g (90% yield) of the desired porphyrin. $^1$H NMR (400 MHz) δ−2.74 (2H, s, —NH), 0.91 (12H, t, J=7 Hz, —CH$_3$), 1.34-1.41 (16H, m, —CH$_2$—), 1.46-1.52 (8H, m, —CH$_2$—), 1.64 (9H, s, —CH$_3$), 1.81-1.88 (8H, m, —CH$_2$—), 2.87 (8H, t, J=8 Hz, —CH$_2$—), 6.82 (1H, s, —NH), 7.41 (2H, s, Ar—H), 7.75 (2H, d, J=8 Hz, Ar—H), 7.82 (4H, s, Ar—H), 8.10 (2H, d, J=8 Hz, Ar—H), 8.82 (4H, s, β-H), 8.92 (2H, d, J=4 Hz, β-H), 9.65 (2H, d, J=5 Hz, β-H); MALDI-TOF-MS m/z calcd. for $C_{67}H_{82}N_5O_2Br$ 1067.6, obsd. 1067.5; UV/vis ($CH_2Cl_2$) 422, 520, 556, 597, 654 (nm).

5-(4-Aminophenyl)-20-bromo-15,20-bis(3,5-dihexylphenyl)porphyrin

To a flask containing a solution of 1.5 g (1.40 mmol) of 5,15-bis(3,5-dihexylphenyl)-10-bromo-20-(tert-butyphenylcarbamate)porphyrin dissolved in 40 mL of methylene chloride was added 60 mL of trifluoroacetic acid. The green solution was stirred under an argon atmosphere for 20 min, after which time TLC (hexanes/methylene chloride, 1/1) indicated that the reaction was complete. The reaction mixture was diluted with 200 mL of methylene chloride and washed with water (200 mL) several times. The organic layer was then washed with aqueous sodium bicarbonate, dried over anhydrous sodium sulfate, and then concentrated to dryness. The residue was chromatographed on silica gel (methylene chloride/hexanes, 3:4/1:1) to give 1.238 g (91% yield) of the required porphyrin. $^1$H NMR (400 MHz) δ −2.71 (2H, s, —NH), 0.91 (12H, t, J=7 Hz, —$CH_3$), 1.34-1.42 (16H, m, —$CH_2$—), 1.46-1.52 (8H, m, —$CH_2$—), 1.81-1.88 (8H, m, —$CH_2$—), 2.86 (8H, t, J=8 Hz, —$CH_2$—), 3.98 (2H, s, —NH), 7.02 (2H, d, J=8 Hz, Ar—H), 7.40 (2H, s, Ar—H), 7.82 (4H, s, Ar—H), 7.94 (2H, d, J=8 Hz, Ar—H), 8.84 (2H, d, J=5 Hz, β-H), 8.87 (2H, d, J=5 Hz, β-H), 8.92 (2H, d, J=5 Hz, β-H), 9.64 (2H, d, J=5 Hz, β-H); MALDI-TOF-MS m/z calcd. for $C_{62}H_{74}N_5Br$ 967.5, obsd. 967.5; UV/vis ($CH_2Cl_2$) 423, 521, 559, 598, 656 (nm).

[5-(4-Aminophenyl)-15-bromo-10,20-bis(3,5-dihexylphenyl)porphyrino]Zinc(II) (Structure 2)

To a flask containing 1.20 g (1.24 mmol) of 5-(4-aminophenyl)-15-bromo-10,20-bis(3,5-dihexylphenyl)porphyrin and 200 mL of methylene chloride was added 50 mL of a saturated solution of zinc acetate dihydrate in methanol. After stirring for 1 h, TLC (hexanes/methylene chloride, 1/1) indicated that all the starting material had been consumed and a single product formed. The pink reaction mixture was washed with water (200 mL) several times and then with aqueous sodium bicarbonate. It was then dried over anhydrous sodium sulfate. The solvent was evaporated and the remaining solid was dried under high vacuum to give 1.211 g (95% yield) of the metalated porphyrin. MALDI-TOF-MS m/z calcd. for $C_{62}H_{72}N_5BrZn$ 1029.4, obsd. 1029.4; UV/vis ($CH_2Cl_2$) 424, 517 (sh), 553, 595 (nm).

Free Base Polymer (Structure 1).

To a 250 mL heavy walled glass flask was added 1.00 g (0.97 mmol) of [5-(4-aminophenyl)-15-bromo-10,20-bis(3,5-dihexylphenyl)porphyrino]zinc (II), 78 mg (0.15 mmol) of bis[(2-diphenylphosphino)phenyl]methane (DPEphos), 442 mg (1.36 mmol) of cesium carbonate and 200 mL of THF. The suspension was flushed with a stream of argon for 15 min, 21 mg (0.01 mmol) of palladium(II) acetate was added and the argon flushing process was continued for a further 10 min. The flask was sealed with a Teflon™ screw plug and the reaction mixture was stirred at 67° C. for 42 h. TLC (methylene chloride/hexanes, 1/1) of the reaction mixture indicated that most or all the starting material had been consumed and that many oligomers had formed. The reaction mixture was filtered through celite and the residual material was thoroughly washed with THF. The combined filtrate was concentrated and dried under high vacuum. This material was dissolved in a mixture of methylene chloride (200 mL) and trifluoroacetic acid (TFA) (200 mL) and stirred under an argon atmosphere for 1 h. The reaction mixture was then diluted with methylene chloride (200 mL) and then washed with water followed by aqueous sodium bicarbonate. The solvent was then evaporated and the residue was chromatographed on silica gel (methylene chloride/2% THF, methylene chloride/20% THF and finally methylene chloride/20% THF/10% methanol) to give three fractions of oligomeric material of Structure 1 (n≥1), the weight of each being, 0.43 g, 0.33 g, and 0.21 g.

A number of embodiments of the invention have been described. Nevertheless, it will be understood that various modifications may be made without departing from the spirit and scope of the invention. Accordingly, other embodiments are within the scope of the following claims.

What is claimed is:

1. A polymer having the structure:

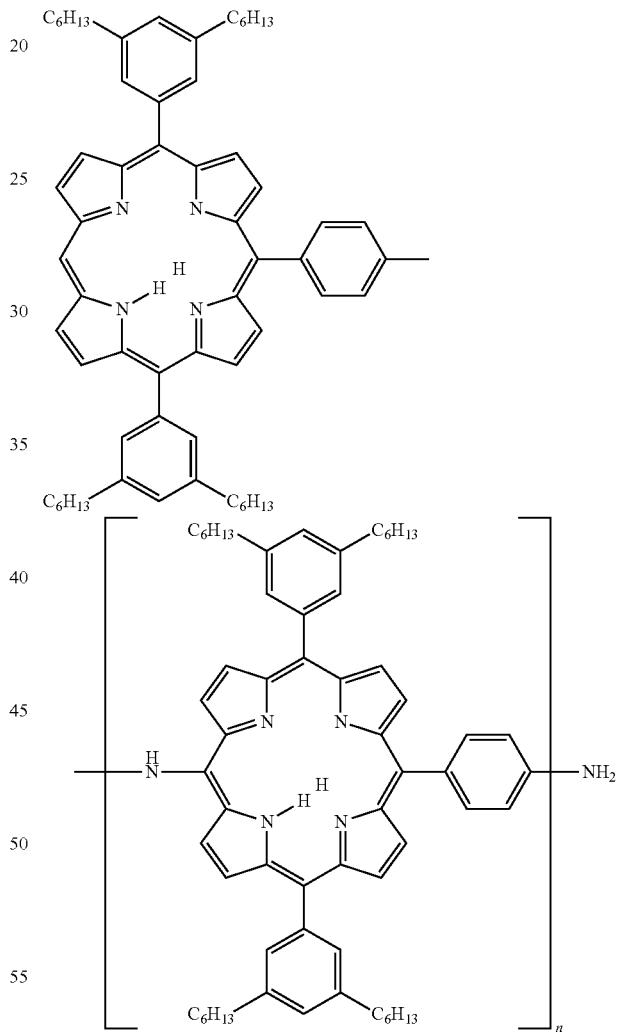

where n is an integer.
2. The polymer of claim 1, wherein n is 1 to 5.
3. The polymer of claim 1, wherein n is greater than 5.
4. A device comprising the polymer of claim 1.
5. The device of claim 4, wherein the device is an electronic device.
6. The device of claim 4, wherein the device is an optoelectronic device.
7. The device of claim 4, wherein the device is a photovoltaic device.

8. A method of synthesizing a porphyrin polymer having Structure 1:

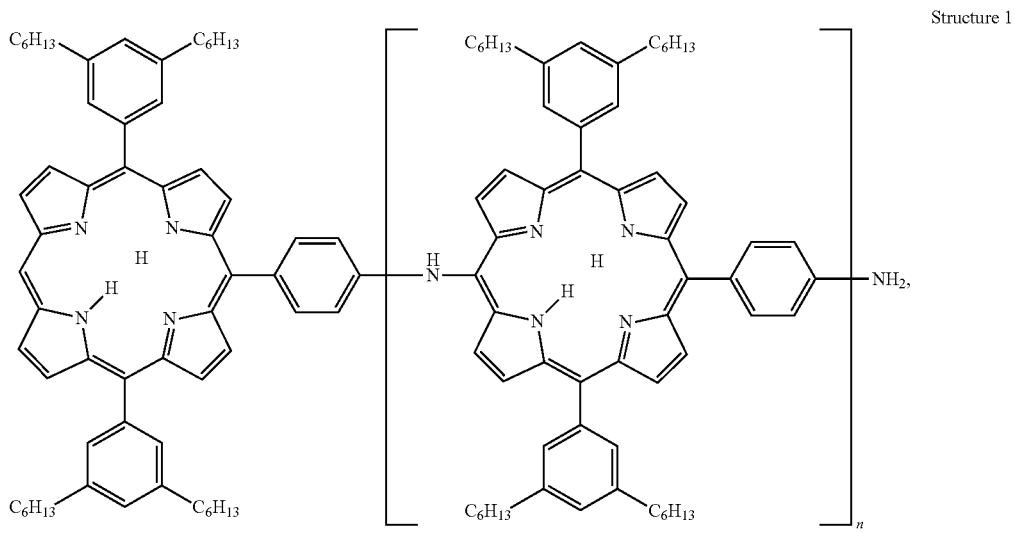

Structure 1 wherein n is an integer, and the porphyrin polymer having Structure 1 is synthesized in bulk.

9. The method of claim 8, wherein synthesizing the porphyrin polymer having Structure 1 occurs in the absence of electropolymerization.

10. The method of claim 8, wherein synthesizing the porphyrin polymer having Structure 1 occurs via a brominated porphyrin monomer.

11. The method of claim 10, wherein synthesizing the porphyrin polymer having Structure 1 occurs via a brominated porphyrin monomer having Structure 2:

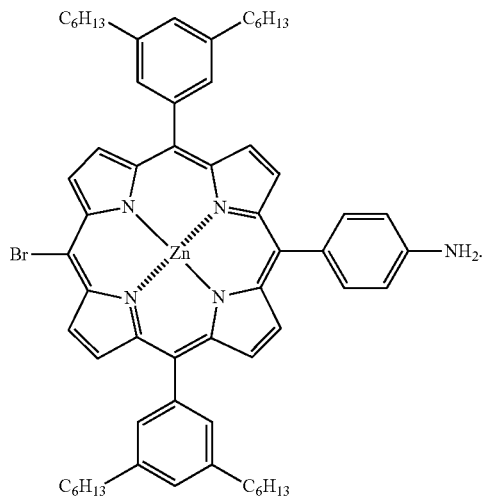

Structure 2

12. The method of claim 11, wherein the brominated porphyrin monomer having Structure 2 is synthesized via a porphyrin monomer having Structure B:

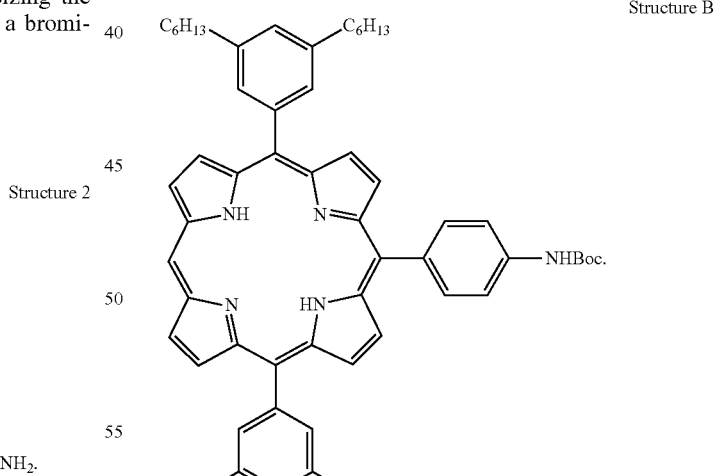

Structure B

13. The method of claim 12, wherein the porphyrin monomer having Structure B is synthesized via a porphyrin monomer having structure A:

Structure A
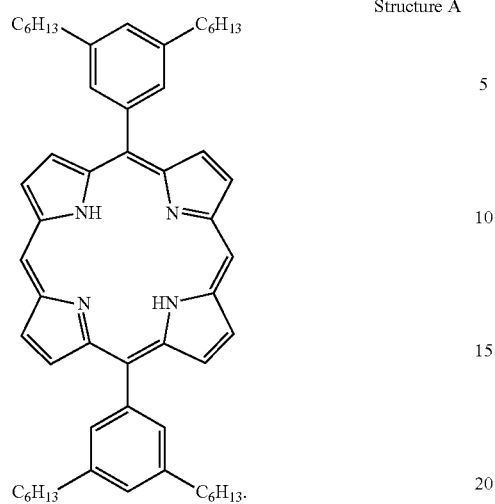
14. The method of claim 8, wherein the porphyrin polymer having Structure 1 is free of defects having Structure 6:
Structure 6
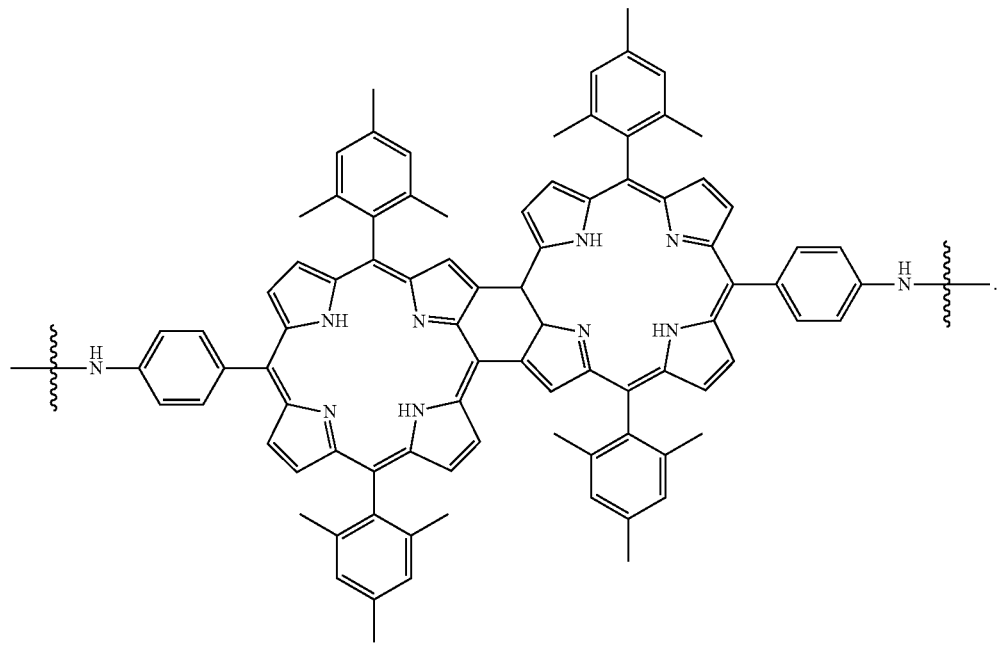
* * * * *